US006696738B1

(12) United States Patent
Tu et al.

(10) Patent No.: US 6,696,738 B1

(45) Date of Patent: Feb. 24, 2004

(54) MINIATURIZED IMAGE SENSOR

(75) Inventors: Hsiu Wen Tu, Hsinchu Hsien (TW); Kuo-Tai Tseng, Hsinchu Hsien (TW)

(73) Assignee: Kingpak Technology Inc., Hsinchu Hsien (TW)

( * ) Notice: Subject to any disclaimer, the term of this patent is extended or adjusted under 35 U.S.C. 154(b) by 0 days.

(21) Appl. No.: 10/293,036

(22) Filed: Nov. 12, 2002

(51) Int. Cl.[7] ................. H01L 31/0232; H01L 31/0203; H01L 21/00; H01L 21/44

(52) U.S. Cl. ....................... 257/433; 257/432; 257/434; 438/57; 438/60; 438/116

(58) Field of Search ................................ 257/432, 433, 257/434, 680, 737, 738, 780, 787, 698, 699, 788, 794; 438/57, 60, 116, 106, 108; 174/52.2; 250/208.1, 214.1, 239, 216

(56) References Cited

U.S. PATENT DOCUMENTS 5,962,810 A * 10/1999 Glenn ....................... 174/52.2

6,492,699 B1 * 12/2002 Glenn et al. ................ 257/433

* cited by examiner

*Primary Examiner*—Donghee Kang

(74) *Attorney, Agent, or Firm*—Pro-Techtor International Services

(57) ABSTRACT

An image sensor includes a substrate, a frame layer, a photosensitive chip and a transparent layer. The substrate is composed of spaced metal sheets. Each metal sheet includes a first board, a second board and a third board connecting the first and second boards, which are located at different heights. The frame layer has an upper surface and a lower surface. The frame layer covers and seals the metal sheets while exposes bottom surfaces of the second boards. The frame layer is formed with a chamber. Bottom surfaces of the first boards are exposed through the chamber, and a transparent region communicating with the chamber is formed on the upper surface of the frame layer. The photosensitive chip formed with bonding pads is disposed within the chamber. The bonding pads contact the bottom surfaces of the first boards. The transparent layer is mounted on the frame layer.

12 Claims, 2 Drawing Sheets

MINIATURIZED IMAGE SENSOR

BACKGROUND OF THE INVENTION

1. Field of the invention

The invention relates to an image sensor, and in particular to a miniaturized image sensor that may be manufactured easily.

2. Description of the Related Art

Referring to FIG. 1, a conventional image sensor includes a substrate 10, a frame layer 18, a photosensitive chip 26, a plurality of wires 28 and a transparent layer 34. The substrate 10 has a first surface 12 formed with signal input terminals 15 and a second surface 14 formed with signal output terminals 16 which are electrically connected to a printed circuit board (not shown). The frame layer 18 has an upper surface 20 and a lower surface 22, which is bonded to the first surface 12 of the substrate 10 to form a cavity 24 together with the substrate 10. The photosensitive chip 26 is arranged within the cavity 24 defined by the substrate 10 and the frame layer 18 and is mounted to the first surface 12 of the substrate 10. Each of the wires 28 has a first terminal 30 electrically connected to the photosensitive chip 26 and a second terminal 32 electrically connected to a corresponding signal input terminal 15 of the substrate 10. The transparent layer 34 is disposed on the upper surface 20 of the frame layer 18.

When the photosensitive chip 26 is made larger, the gap between the chip 26 and the frame layer 18 is shortened. So, it is difficult to bond and electrically connect the wires 28 to the signal input terminals 15 of the substrate 10 owing to the shortened gap. It is possible to enlarge the substrate 10. However, enlarging the substrate 10 cannot meet the miniaturized requirement.

Furthermore, a substrate 10 has to be prepared in advance, traces have to be formed on the substrate 10, and a frame layer 18 has to be adhered onto the substrate 10. Consequently, the manufacturing processes are complicated and the material costs are relatively high.

In view of the above-mentioned problems, it is therefore an object of the invention to provide a miniaturized image sensor that may be made conveniently.

SUMMARY OF THE INVENTION

An object of the invention is to provide a miniaturized image sensor that is easy to be manufactured with a high yield.

Another object of the invention is to provide a miniaturized image sensor that may be manufactured with lower costs.

Still another object of the invention is to provide a miniaturized image sensor having a relatively small height.

To achieve the above-mentioned objects, an image sensor of the invention includes a substrate, a frame layer, a photosensitive chip and a transparent layer. The substrate is composed of plural spaced metal sheets. Each metal sheet includes a first board, a second board and a third board connecting the first board to the second board. The first and second boards are located at different heights. The frame layer has an upper surface and a lower surface. The frame layer covers and seals the metal sheets while exposes bottom surfaces of the second boards of the metal sheets. The frame layer is formed with a chamber on the lower surface thereof. Bottom surfaces of the first boards of the metal sheets are exposed through the chamber, and a transparent region communicating with the chamber is formed on the upper surface of the frame layer. The photosensitive chip is formed with a plurality of bonding pads and disposed within the chamber. The bonding pads respectively contact the bottom surfaces of the first boards of the substrate in a flip-chip manner for signal transmission from the photosensitive chip, which receives optical signals passing through the transparent region of the frame layer. The transparent layer is mounted on the upper surface of the frame layer to cover the transparent region of the frame layer.

Accordingly, the overall height of the package may be reduced because the photosensitive chip is disposed within the chamber and is electrically connected to the substrate in a flip-chip manner. Furthermore, the manufacturing processes are more convenient because the metal sheets and the frame layer are formed integrally and no traces have to be formed on the substrate.

DETAILED DESCRIPTION OF THE INVENTION

Figure 1:
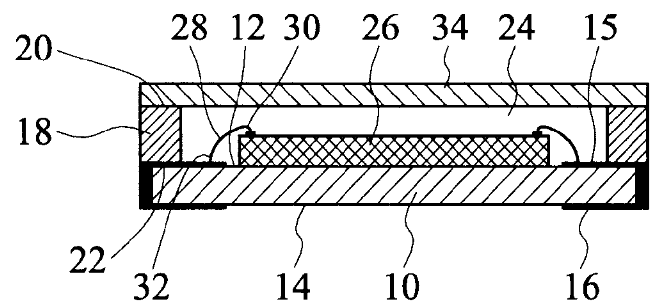
FIG. 1 is a schematic illustration showing a conventional image sensor.
Figure 2:
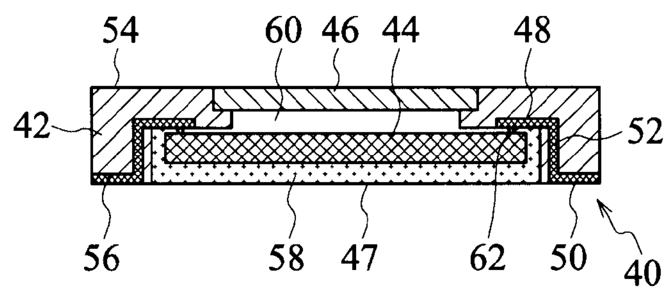
FIG. 2 is a cross-sectional view showing an image sensor according to a first embodiment of the invention.
Figure 3:
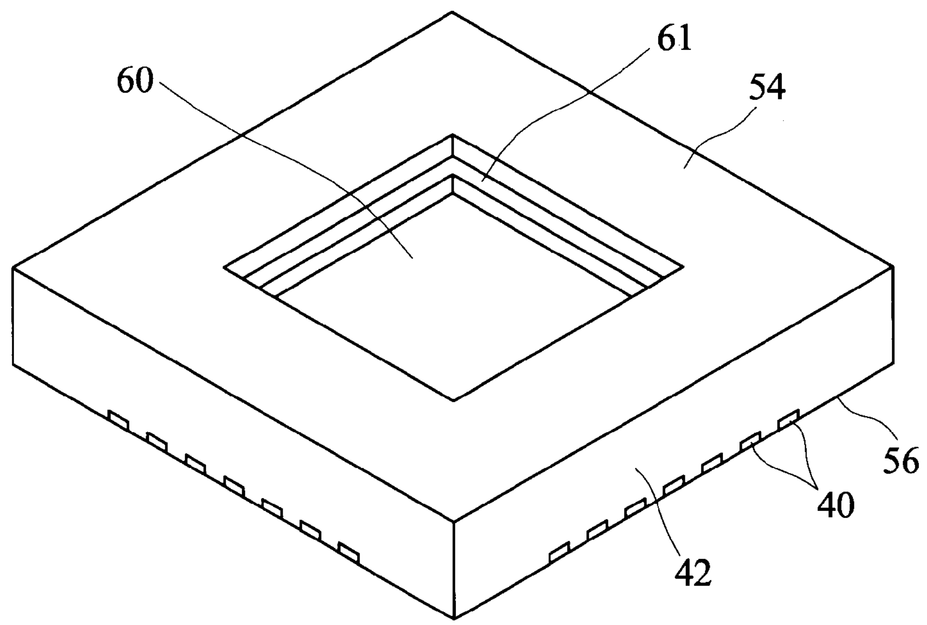
FIG. 3 is a pictorial view showing the image sensor without a transparent layer according to the first embodiment of the invention.

Referring to FIGS. 2 and 3, the image sensor according to a first embodiment of the invention includes a substrate 40, a frame layer 42, a photosensitive chip 44, a transparent layer 46 and a glue layer 47.

The substrate 40 is composed of plural spaced metal sheets. Each of the metal sheets includes a first board 48, a second board 50 and a third board 52 connecting the first board 48 to second board 50, wherein the first and second boards 48 and 50 are located at different heights, and the third board 52 is perpendicular to the first board 48 and the second board 50.

The frame layer 42 is made of thermoplastic material, which may cover and seal the metal sheets by way of die pressing or injection molding. The frame layer 42 has an upper surface 54 and a lower surface 56. The bottom surfaces of the second boards 50 of the metal sheets are exposed to the outside to form signal output terminals electrically connected to a printed circuit board (not shown). A chamber 58 is formed on the lower surface 56 of the frame layer 42, and bottom surfaces of the first board 48 of the metal sheets are exposed through the chamber 58 to form signal input terminals. A transparent region 60 communicating with the chamber 58 is formed on the upper surface 54 of the frame layer 42. The periphery of the transparent region 60 is formed with a ledge 61 for receiving, supporting and positioning the transparent layer 46. Therefore, the height of the package may be reduced and the transparent layer 46 may be easily mounted.

The photosensitive chip 44 has a plurality of bonding pads 62 within the chamber 58. The bonding pads 62 for transmitting signals from the photosensitive chip 44 are electrically connected to the bottom surfaces of the first boards 48 of the substrate 40 in a flip-chip manner. The photosensitive chip 44 may receive optical signals passing through the transparent region 60 of the frame layer 42.

The transparent layer 46 may be a piece of transparent glass, which covers the transparent region 60 and is positioned on the ledge 61 at the periphery of the transparent region 60. Therefore, the photosensitive chip 44 may receive optical signals passing through the transparent layer 46.

The glue layer 47 is filled into the chamber 58 of the frame layer 42 to cover and seal the photosensitive chip 44.

In this embodiment, the photosensitive chip 44 is disposed within the chamber 58 and is electrically connected to the substrate 40 in a flip-chip manner. Therefore, the height of the package may be reduced and the product may be miniaturized.

Figure 4:
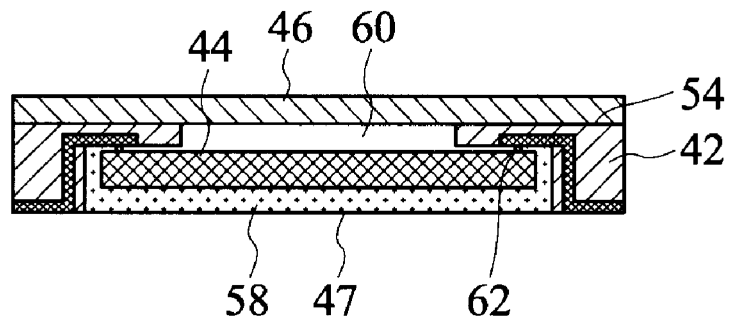
FIG. 4 is a cross-sectional view showing an image sensor according to a second embodiment of the invention.

Furthermore, in an image sensor according to a second embodiment of the invention as shown in FIG. 4, the frame layer 42 is a flat surface without a ledge formed at the periphery of the transparent region 60. The transparent layer 46 may be directly placed on the upper surface 54 of the frame layer 42 to encapsulate or cover the photosensitive chip 44. Then, the photosensitive chip 44 may receive optical signals passing through the transparent layer 46.

Figure 5:
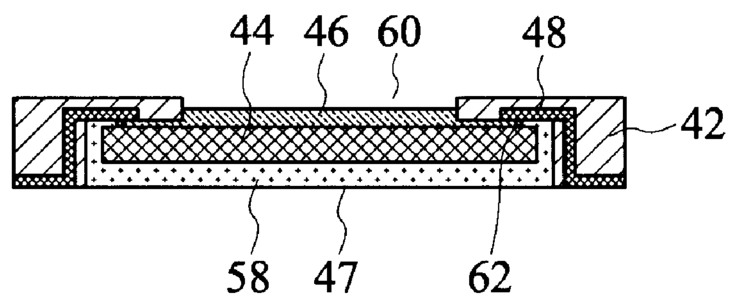
FIG. 5 is a cross-sectional view showing an image sensor according to a third embodiment of the invention.

Please refer to FIG. 5, which shows an image sensor according to a third embodiment of the invention. The transparent layer 46 is made of transparent glue. After the photosensitive chip 44 is disposed within the chamber 58 and the bonding pads 62 are electrically connected to the bottom surfaces of the first board 48 of the substrate 40 in a flip-chip manner, the transparent glue is filled into the transparent region 60 to seal the photosensitive chip 44, which may receive optical signals passing through the transparent glue.

According to the above-mentioned structures, the invention has the following advantages.

1. Since the frame layer 42 and the substrate 40 are formed integrally, it is more convenient for the signal transmission via the plurality of metal sheets of the substrate 40.

2. The overall package height may be effectively reduced to meet the miniaturized requirement because the photosensitive chip 44 is placed within the chamber 58 and the transparent layer 46 is placed on the ledge 61 formed in the frame layer 42.

3. Using the transparent glue to form the transparent layer 46, the material cost is far less than that for the transparent glass and the manufacturing costs may be effectively reduced.

While the invention has been described by way of examples and in terms of preferred embodiments, it is to be understood that the invention is not limited to the disclosed embodiments. To the contrary, it is intended to cover various modifications. Therefore, the scope of the appended claims should be accorded the broadest interpretation so as to encompass all such modifications.

What is claimed is:

1. An image sensor, comprising:

a substrate composed of plural spaced metal sheets, each of the metal sheets including a first board, a second board and a third board connecting the first board to the second board, wherein the first and second boards are located at different heights;

a frame layer having an upper surface and a lower surface, the frame layer covering and sealing the metal sheets while exposing bottom surfaces of the second boards of the metal sheets, the frame layer being formed with a chamber on the lower surface thereof, bottom surfaces of the first boards of the metal sheets being exposed through the chamber, and a transparent region communicating with the chamber being formed on the upper surface of the frame layer;

a photosensitive chip formed with a plurality of bonding pads and disposed within the chamber, the bonding pads respectively contacting the bottom surfaces of the first boards of the metal sheets in a flip-chip manner for signal transmission from the photosensitive chip, which receives optical signals passing through the transparent region of the frame layer; and a transparent layer mounted on the upper surface of the frame layer to cover the transparent region of the frame layer.

2. The image sensor according to claim 1, wherein the frame layer is made of thermoplastic material by way of injection molding.

3. The image sensor according to claim 1, wherein the frame layer is made of thermoplastic material by way of die pressing.

4. The image sensor according to claim 1, wherein the transparent region is formed with a ledge for supporting the transparent layer.

5. The image sensor according to claim 1, wherein the third board is perpendicular to the first and second boards.

6. The image sensor according to claim 1, wherein the transparent layer is a piece of transparent glass.

7. The image sensor according to claim 1, further comprising a glue layer filled into the chamber to cover and seal the photosensitive chip.

8. An image sensor, comprising:

a substrate composed of plural spaced metal sheets, each of the metal sheets including a first board, a second board and a third board connecting the first board to the second board, wherein the first and second boards are located at different heights;

a frame layer having an upper surface and a lower surface, the frame layer covering and sealing the metal sheets while exposing bottom surfaces of the second boards of the metal sheets, the frame layer being formed with a chamber on the lower surface thereof, bottom surfaces of the first boards of the metal sheets being exposed through the chamber, and a transparent region communicating with the chamber being formed on the upper surface of the frame layer;

a photosensitive chip formed with a plurality of bonding pads and disposed within the chamber, the bonding pads respectively contacting the bottom surfaces of the first boards of the metal sheets in a flip-chip manner and for signal transmission from the photosensitive chip, which receives optical signals passing through the transparent region of the frame layer; and transparent glue applied to the transparent region of the frame layer to cover the photosensitive chip.

9. The image sensor according to claim 8, wherein the frame layer is made of thermoplastic material by way of injection molding.

10. The image sensor according to claim 8, wherein the frame layer is made of thermoplastic material by way of die pressing.

11. The image sensor according to claim 8, wherein the third board is perpendicular to the first and second boards.

12. The image sensor according to claim 8, further comprising a glue layer filled into the chamber to cover and seal the photosensitive chip.

* * * * *